United States Patent [19]
Hwang

[11] Patent Number: 6,054,878
[45] Date of Patent: Apr. 25, 2000

[54] ADDRESS TRANSITION DETECTION SUMMATION CIRCUIT

[75] Inventor: Myoung-Ha Hwang, Cheongju, Rep. of Korea

[73] Assignee: LG Semicon Co., Ltd., Cheongju, Rep. of Korea

[21] Appl. No.: 09/053,623

[22] Filed: Apr. 2, 1998

[30] Foreign Application Priority Data

Apr. 25, 1997 [KR] Rep. of Korea ........................ 97-15621

[51] Int. Cl.⁷ .................................................. H03K 5/19
[52] U.S. Cl. ............................................................ 327/18
[58] Field of Search .................................... 327/18, 19, 20, 327/26, 36, 105, 107, 141, 112, 49, 166, 170, 185; 365/233, 233.5; 326/56–58

[56] References Cited

U.S. PATENT DOCUMENTS

| | | | |
|---|---|---|---|
| 5,262,994 | 11/1993 | McClure | 365/200 |
| 5,448,529 | 9/1995 | Reddy et al. | 365/233.5 |
| 5,604,712 | 2/1997 | Priebe | 365/230.06 |
| 5,682,355 | 10/1997 | Roohparvar | 365/233.5 |
| 5,815,464 | 9/1998 | Golla et al. | 365/233.5 |
| 5,886,949 | 3/1999 | Villa et al. | 365/233.5 |

OTHER PUBLICATIONS

Chu, Sow T., et al., "A 25–ns Low–Power Full–CMOS I–Mbit (128K X 8) SRAM," IEEE Journal of Solid–State Circuits, vol. 23, No. 5, pp. 1078 –1083, Oct., 1988.

*Primary Examiner*—My-Trang Nuton
*Attorney, Agent, or Firm*—Fleshner & Kim, LLP

[57] ABSTRACT

An address transition detection summation circuit is provided that selectively maintains an input voltage of a pull-up circuit at an intermediate level during a pull-up time. The address transition detection summation circuit includes a pull-up circuit and an address transition detection summation unit for summing a plurality of ATD signals. A delay unit delays an address transition detection summation node signal and can determine a pulse width of the address transition detection summation signal. An input signal generation unit can maintain the input level of the pull-up circuit at an intermediate level. Thus, although a short pulse ATD signal or a standard pulse ATD signal is inputted, a width of an address transition detection summation signal is made as wide as the ATD signal. Thus, the address transition detection summation signal more rapidly responds to the short pulse, which can prevent a failure of a chip operation.

22 Claims, 4 Drawing Sheets

ADDRESS TRANSITION DETECTION SUMMATION CIRCUIT

BACKGROUND OF THE INVENTION

1. Field of the Invention

The present invention relates to a summation circuit and more particularly, an address transition detection summation circuit.

2. Background of the Related Art

FIG. 1 illustrates a related art address transition detection summation circuit. As shown in FIG. 1, the related art address transition detection summation circuit includes a first inverter IN1 and a second inverter IN2 connected in parallel to respectively invert a chip enable signal CSB. A PMOS transistor P1 has a source receiving a power supply voltage Vcc and a drain connected to a node ATDSO and performs a pull-up function. An address transition detection summation unit 10 formed in a wired-OR type is provided with a plurality of NMOS transistors N1 to Nn. The NMOS transistors N1 to Nn include gates that respectively receive an address transition detection (ATD) signal ATD1 to ATDn, sources respectively connected to a ground voltage Vss, drains connected in parallel to the node ATDS0 and perform a pull-down function. The address transition detection summation unit 10 sums an output from the PMOS transistor P1 and outputs from the plurality of NMOS transistors N1 to Nn.

The address transition detection summation circuit further includes a delay unit 20 having third through sixth inverters IN3–IN6 connected in series to delay a signal from the node ATDS0 and determine a pulse width of an address transition detection summation signal. A seventh inverter IN7 inverts an output from the delay unit 20. A NAND gate NA1 performs a NAND operation of a pair of outputs respectively received from the seventh inverter IN7 and the first inverter IN1 and transmits an output signal to a gate of the pull-up PMOS transistor P1. A signal output unit 30, includes eighth and ninth inverters IN8–IN9 connected in series to an output side of the node ATDS0 to output a final address transition detection summation signal ATDSUM. The number of inverters in the delay unit 20 and the signal output unit 30 is an even number.

The operation of the related art address transition detection summation circuit will now be described. As shown in FIG. 2A, when a normal ATD signal is inputted to the address transition detection summation unit 10, the node ATDS0, which is initially at a high level in the early stage, is pulled down and becomes a low level.

After a signal from the node ATDS0 is delayed by the delay unit 20, it is input to the seventh inverter IN7. When an output from the NAND NA1, which receives a signal inverted by the seventh inverter IN7 and an output signal from the first inverter IN1, becomes a low level, the pull-up PMOS transistor P1 is turned on and the node ATDS0 again becomes a high level. The address transition detection summation signal ATDSUM is then generated as an output from the signal output unit 30. As shown in FIG. 2B, when the PMOS transistor P1 is turned on, an input voltage level becomes a high level (Vcc).

As shown in FIG. 2C, when an ATD signal of a short pulse, which has an amplitude modulation at an intermediate level, is inputted to the address transition detection summation unit 10, a driving force of the pull-up PMOS transistor P1 is greater than that of the plurality of pull-down NMOS transistors N1 to Nn receiving the short pulse. Upon summing address transition detection signals for the short pulse ATD signal, the node ATDS0 maintains a high level by receiving an output from the pull-up PMOS transistor P1. Accordingly, as shown in FIG. 2C, a signal width of the final address transition detection summation signal ATDSUM does not enlarge lengthen).

When the ATD signal of the short pulse is inputted, for example, to a decoding unit of a SRAM circuit (not illustrated), a decoding signal responds to the short pulse, whereby a word line signal or a column select signal is converted and used to select a memory cell. In addition, in a control unit (not illustrated), an address transition detection summation signal controlling an internal circuit responds to the ATD signal of the short pulse, to drive an external circuit.

However, the related art addresses transition detection summation circuit has various disadvantages. When a pull-up PMOS transistor P1 is turned on and a ATD signal of a short pulse is inputted to the related art address transition detection summation circuit, a gate input voltage of the PMOS transistor P1 becomes the high level voltage, Vcc. Therefore, a driving force of the PMOS transistor P1 becomes greater than that of the plurality of NMOS transistors N1 to Nn that receive the short pulse. Thus, a pulse width of the final address transition detection summation signal ATDSUM does not enlarge as wide as the short pulse. Accordingly, the final address transition detection summation signal controlling the internal circuit is not able to respond to the ATD signal of the short pulse, whereby a decoding signal and a control signal mismatch can cause a failure to a chip operation.

SUMMARY OF THE INVENTION

An object of the present invention is to provide an address transition detection summation circuit that solves at least the problems and disadvantages of the related art.

Another object of the present invention to provide an address transition detection summation circuit that enlarges a signal width of an address transition detection summation signal based on variably sized pulse.

A further object of the present invention is to provide an address transition detection summation circuit that sensitively responds to a short pulse address transition detection circuit by maintaining a pull-up circuit at an intermediate level during the pull-up time.

To achieve at least the above objects in whole or in parts, there is provided an address transition detection summation circuit according to the present invention that includes a transistor for performing a pull-up function, an address transition detection summation unit for summing an output from the transistor and an externally input ATD signal, a delay unit for delaying an address transition detection summation node signal, and an address transition detection summation circuit provided with a plurality of inverters that includes an input signal generation unit for maintaining the input level of the transistor at an intermediate level. Although the address transition detection summation circuit according to present invention receives short and standard pulse ATD signals, the address transition detection summation circuit enlarges a signal width of the address transition detection summation signal as wide as that of the short pulse, which enables the final address transition detection summation signal to respond to the short pulse.

To further achieve the above objects in a whole or in parts, there is provided an address transition detection summation circuit according to the present invention that includes a pull-up circuit that performs pull-up based on an applied signal, an address transition detection summation unit that sums outputs from the pull-up circuit and a plurality of switching circuits that respectively receive an address transition detection signal and an input signal generation unit that generates a tri-level applied signal for the pull-up circuit based on a signal from the address transition detection summation circuit.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
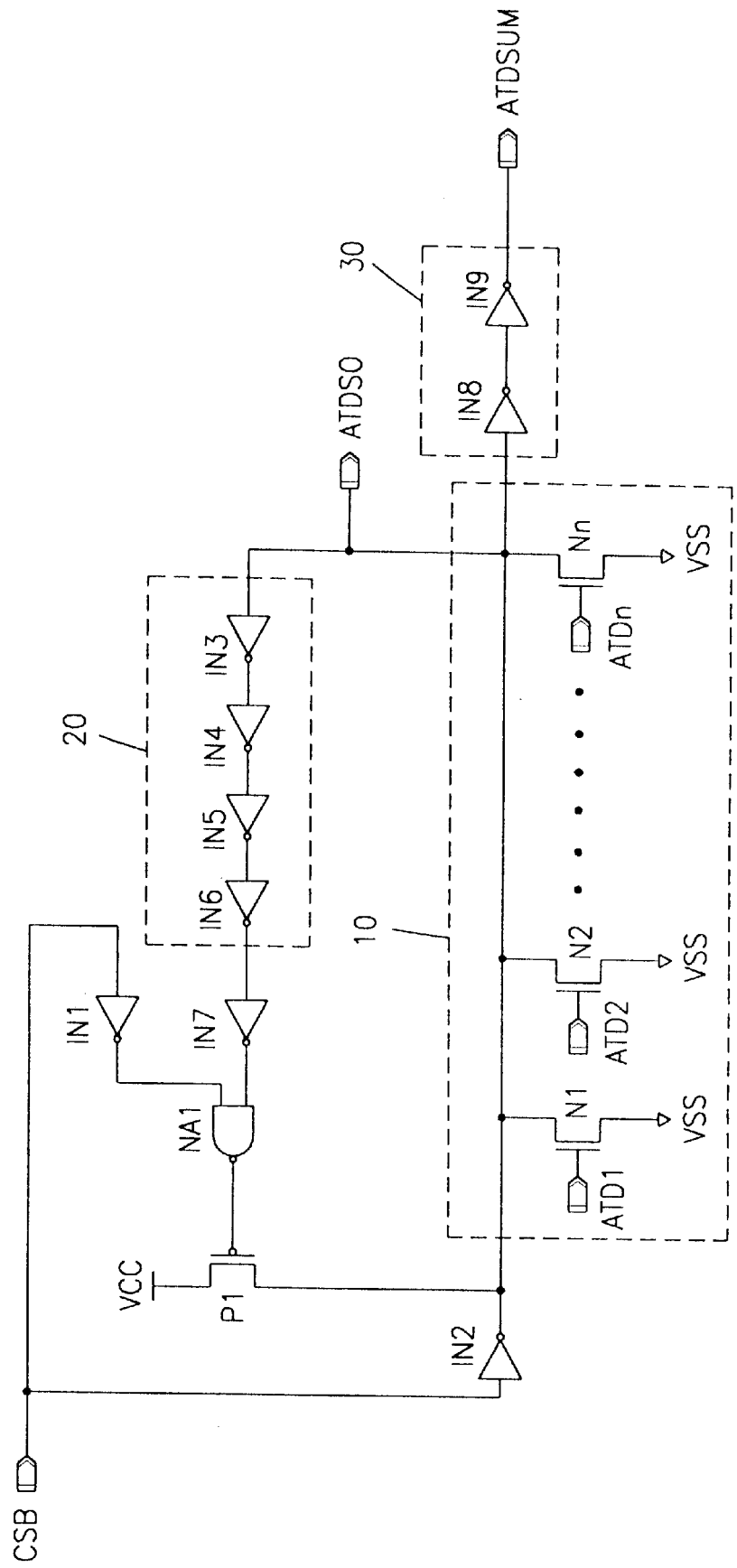
FIG. 1 is a block diagram illustrating a related art address transition detection summation circuit.
Figure 2A:
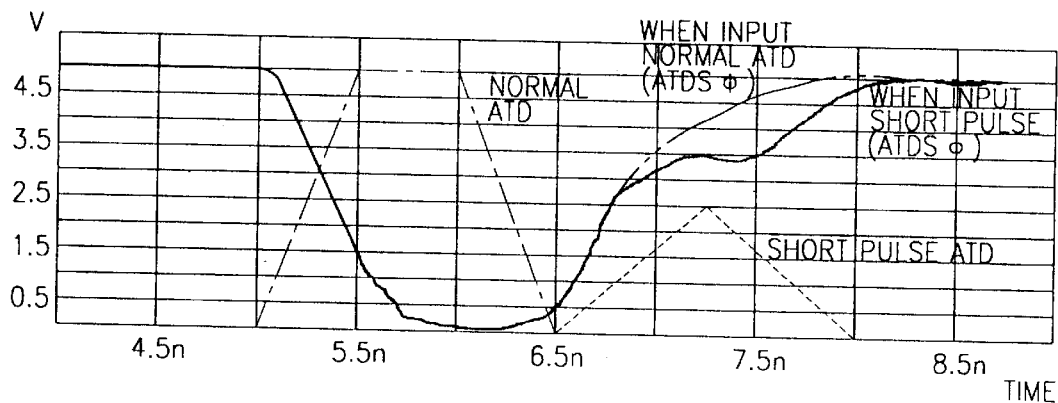
FIGS. 2A to 2C are diagrams illustrating waveforms of the address transition detection summation circuit of FIG. 1.
Figure 2B:
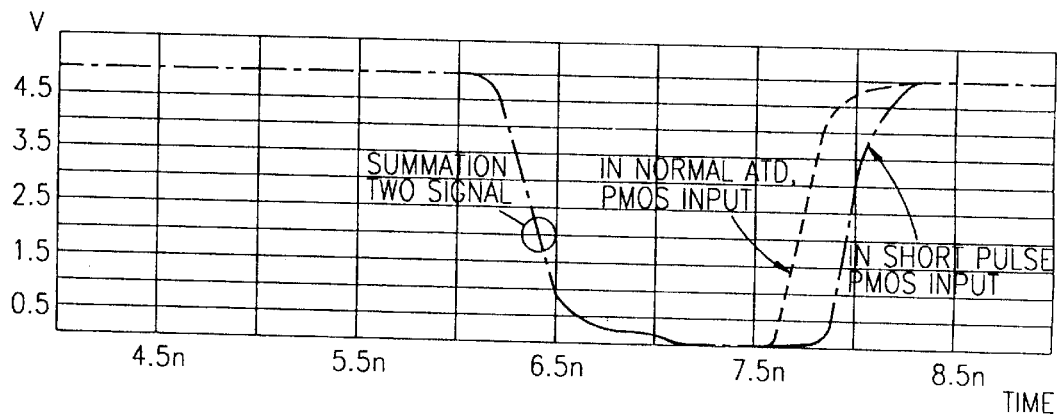
Figure 2C:
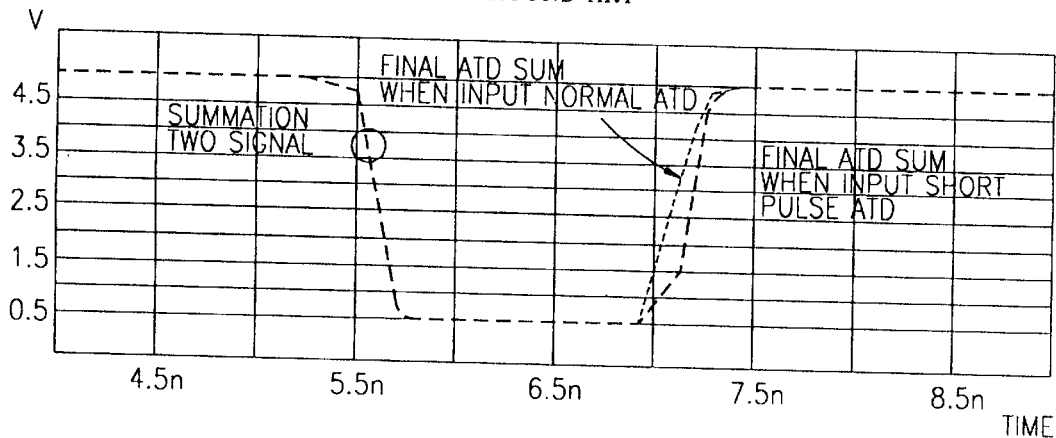
Figure 3:
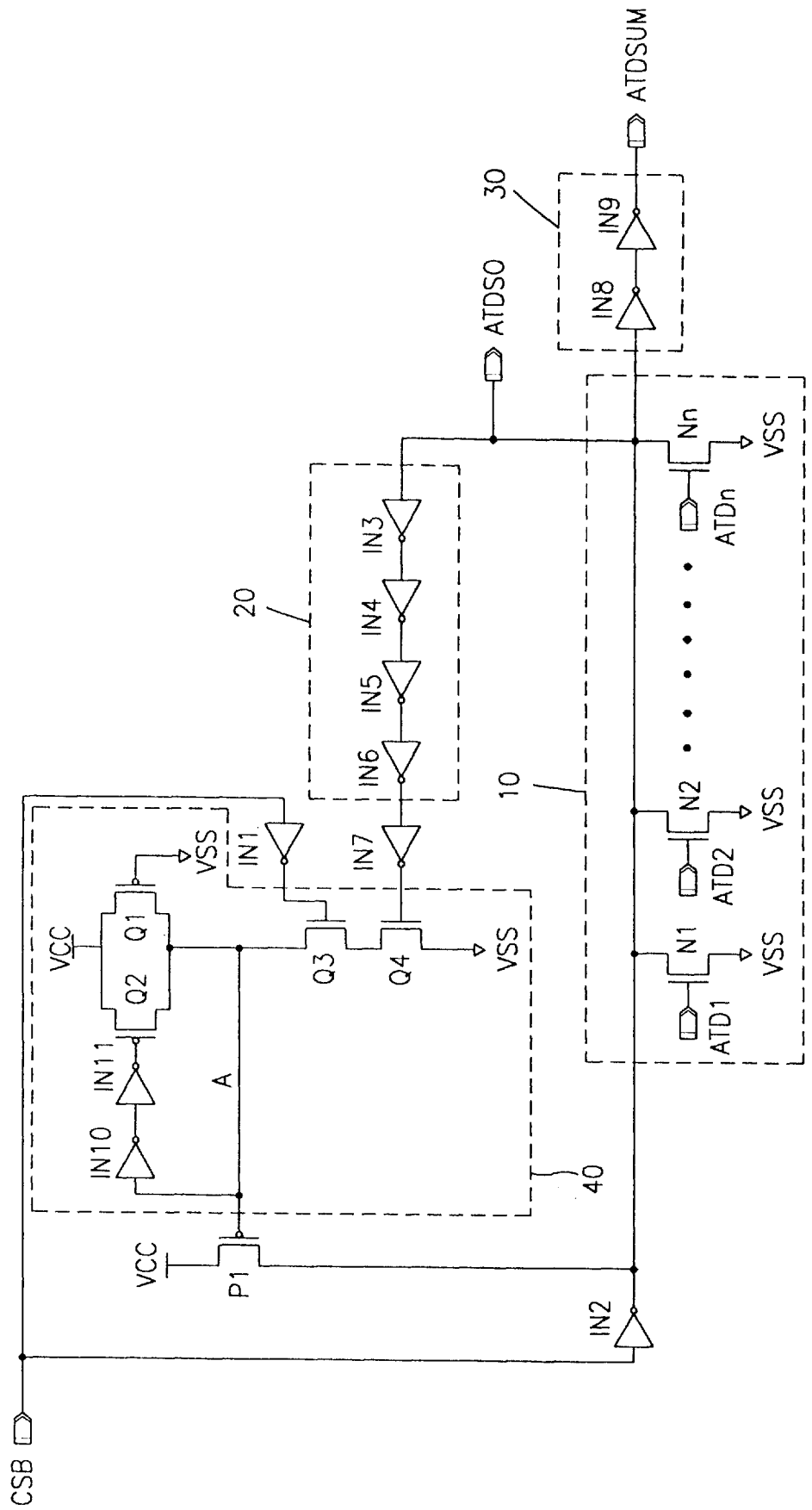
FIG. 3 is a block diagram illustrating a preferred embodiment of an address transition detection summation circuit according to the present invention.

As shown in FIG. 3, a preferred embodiment of an address transition detection summation circuit according to the present invention includes an first inverter IN1 and a second inverter IN2 that are coupled in parallel and invert a chip enable signal CSB. A PMOS transistor P1 performs a pull-up function. An address transition detection summation unit 10 sums an output from the PMOS transistor and outputs outputted from a plurality of NMOS transistors based a plurality of address transition detections. A delay unit 20 delays an address transition detection summation node signal ATDS0 and determines a pulse width of the address transition detection summation signal. A signal output unit 30 outputs a final address transition detection summation signal. The address transition detection summation unit 10, the delay unit 20 and the signal output unit 30 are similar to the related art. Accordingly, a detailed description is omitted. The preferred embodiment of the address transition detection summation circuit also includes an input signal generation unit 40 that maintains an input level of the PMOS transistor P1 at an intermediate level and a seventh inverter IN7 that inverts an output from the delay unit 20.

In the input signal generation unit 40, sources of a first PMOS transistor Q1 and a second PMOS transistor Q2 are coupled in parallel to a power supply voltage Vcc and a first NMOS transistor Q3 and a second NMOS transistor Q4 are coupled in series between a node A and a ground voltage Vss. The node A is also coupled to drains of the first PMOS transistor Q1 and the second PMOS transistor Q2.

A ground voltage Vss is applied to a gate of the first PMOS transistor Q1. The node A is coupled to a gate of the second PMOS transistor Q2 through series coupled inverters IN10 and IN11. Thus, a signal from the node A feeds back through the tenth inverter IN10 and the eleventh inverter IN11 to the gate of the second NMOS transistor Q2.

The chip enable signal is inverted by the first inverter IN1 and applied to a gate of the first NMOS transistor Q3. The inverted output from the delay unit 20 is applied by the seventh inverter IN7 to a gate of the second NMOS transistor Q4. The node A is coupled to the common drain of the first and second PMOS transistors Q1 and Q2, the first NMOS transistor Q3, and a gate of the PMOS transistor P1 having the pull-up function.

Figure 4A:
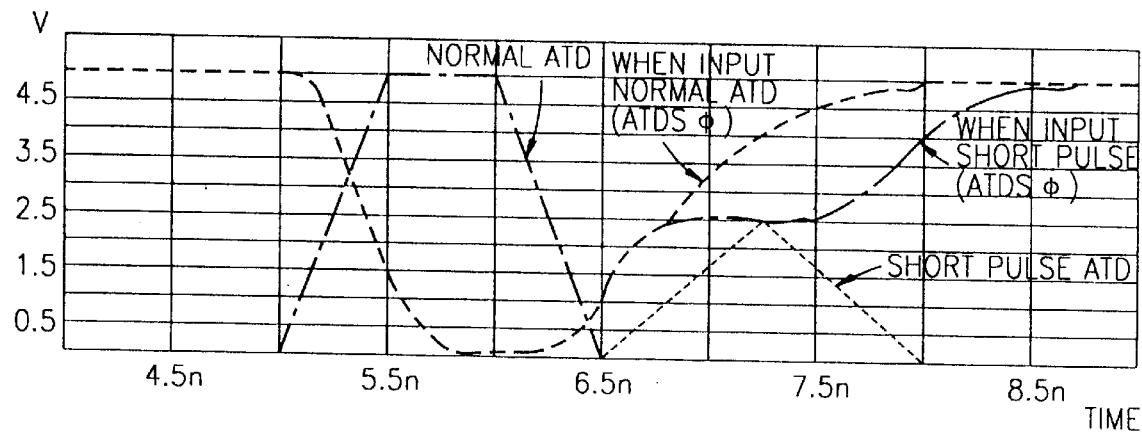
FIG. 4A to 4C are diagrams illustrating waveforms of the address transition detection summation circuit of FIG. 3.

Operations of the preferred embodiment of the address transition detection summation circuit according to the present invention will now be described. As shown in FIG. 4A, when a normal ATD signal is inputted to the address transition detection summation unit 10, a node ATDS0, which is initially at a high level, becomes a low level. Then, a signal outputted from the node ATDS0 is delayed by passing through the delay unit 20. The delayed signal output from the node ATSD0 is inputted to the PMOS transistor P1 having a pull-up function after passing through the input signal generation unit 40 and the inverter IN7. Thus, an input level of the PMOS transistor P1 becomes a low level, whereby the PMOS transistor P1 is turned on and the node ATDS0 is again converted to a high level based on an output from the PMOS transistor P1.

At this time, the PMOS transistors P1, Q2 are turned off in accordance with an output from the first PMOS transistor Q1 of the input signal generation unit 40. A power supply voltage Vss is applied to a gate of the first PMOS transistor Q1. Accordingly, the first PMOS transistor Q1 is always turned on. When the address transition detection summation circuit is operated in accordance with the chip enable signal CSB, the first and second NMOS transistors Q3, Q4 are respectively turned on in accordance with an inverted chip enable signal CSB output by the inverter IN1 and an inverted output signal from the delay unit 20 via the inverter IN7.

An output from the first NMOS transistor Q3 is sequentially delayed by passing through the tenth inverter IN10 and the eleventh inverter IN11 and is fed back into the gate of the second PMOS transistor Q2. In this manner, the second PMOS transistor Q2 is also turned on. As described above, the first NMOS transistor Q3 and the second PMOS transistor Q2 are both on at the same time whereby a voltage level of the node A becomes an intermediate voltage level. Since the first PMOS transistor Q1 is preferably relatively small in size, a voltage level of the node A is not substantially affected by the first PMOS transistor Q1. The voltage level of the node A is substantially determined by a turn-on resistance rate of the first and the second transistors Q3, Q4 and the second PMOS transistor Q2.

Figure 4B:
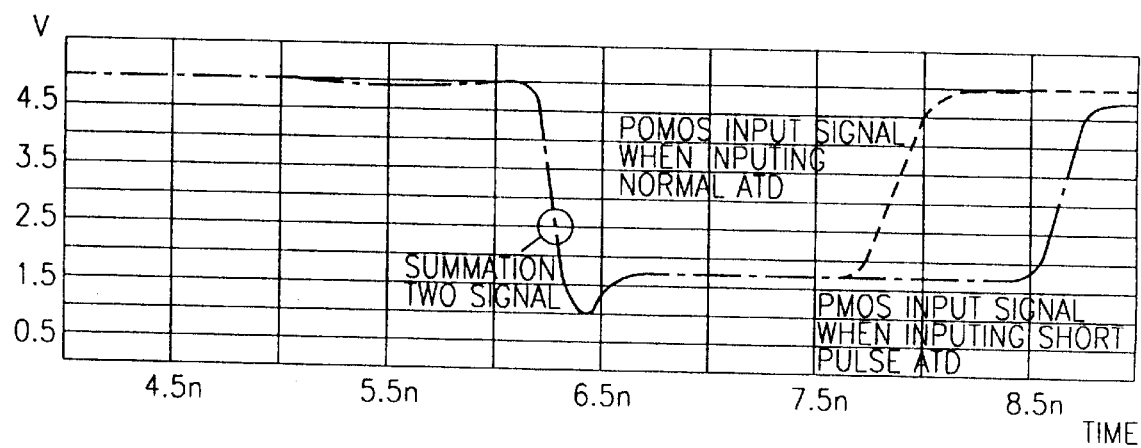

The PMOS transistor P1 for performing a pull-up is preferably slightly turned on at an intermediate voltage level in accordance with the signal from the node A. As shown in FIG. 4B, an input level of the PMOS transistor P1 maintains an intermediate level because of a voltage level of the first and the second NMOS transistors Q3, Q4 and the second PMOS transistor Q2. When the input voltage level of the PMOS transistor P1 is an intermediate level, a driving force of the PMOS transistor P1 is less than when the input voltage level of the PMOS transistor P1 is a high level Vcc.

As described above, when the PMOS transistor P1 is turned on at an intermediate voltage level and an ATD signal of a short pulse in inputted to the address transition detection summation unit 10, the driving force of the PMOS transistor P1 is diminished. Accordingly, the driving force of the plurality of NMOS transistors N1 to Nn is increased relative to the PMOS transistor P1.

Figure 4C:
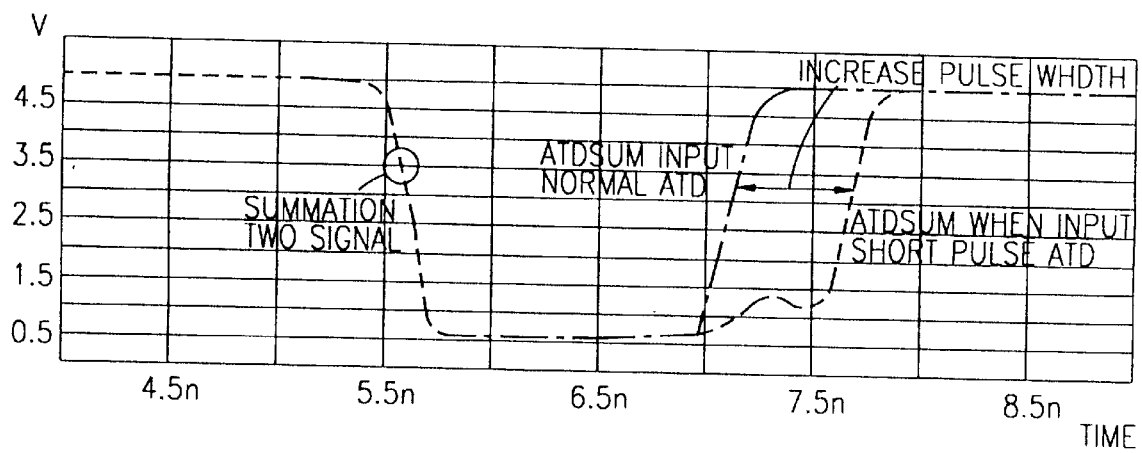

As shown in FIG. 4C, an address transition detection summation signal ATDSUM maintains a low voltage level as the short pulse, whereby the pulse width of the final address transition detection summation signal is enlarged as wide as the short pulse. Accordingly, when the PMOS transistor P1 having a pull-up function in turned on, (i.e., the pull-up time of the PMOS transistor P1), the address transition detection summation circuit according to the preferred embodiment maintains an input level of the PMOS transistor P1 not at a high level Vcc, but at an intermediate level. Thus, the pulse width of the address transition detection summation signal is enlarged (lengthened) although the short pulse ATD signal is input.

As described above, the preferred embodiment of the address transition detection summation circuit has various advantages. The preferred embodiment of the address transition detection summation circuit selectively maintains the gate voltage of the PMOS transistor at an intermediate level during the pull-up time, enlarges the pulse width of the address transition detection summation signal as wide as that of the short pulse, and enables the address transition detection summation signal to sensitively respond to the short pulse. Thus, a decoding signal and a control signal mismatch can be prevented. Accordingly, failure of a chip operation is prevented.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. An address transition detection summation circuit, comprising;
    pull-up means that performs a pull-up of an input signal;
    an address transition detection summation unit that sums an output from the pull-up means and outputs from a plurality of switching circuits that respectively receive an address transition detection (ATD) signal;
    a delay unit that delays a signal from the address transition detection summation unit; and
    an input signal generation unit coupled to the delay unit that selectively drives an input signal level of the pull-up means at each of a high level, an intermediate level and a low level, wherein the intermediate level is between the high level and the low level.

2. The circuit of claim 1, wherein the input signal generation unit maintains the intermediate input signal level when the ATD signal is a short pulse ATD signal.

3. The circuit of claim 1, further comprising a signal output unit coupled to the pull-up means, the address transition detection summation unit and the delay unit that outputs an address transition detection summation signal for transmission to an external circuit.

4. The circuit of claim 3, wherein the delay unit and the signal output unit comprise an even number of inverters, wherein the ATD signal includes a plurality of ATD unit partial signals, and wherein the ATD signal is one of a short pulse ATD signal and a standard pulse ATD signal.

5. The circuit of claim 1, wherein the address transition detection summation unit is a wired-OR circuit.

6. The circuit of claim 1, wherein the delay unit and a signal output unit comprise a plurality of inverters.

7. The circuit of claim 1, wherein the delay unit determines a width of an address transition detection summation signal.

8. The circuit of claim 1, wherein the input signal generation unit comprises:
    first and second transistors coupled in parallel between a first reference voltage and a node; and
    third and fourth transistors coupled in series between the node and a second reference voltage, wherein the node is coupled to drains of the first and second transistors, wherein the second reference voltage is applied to a gate of the first transistor, wherein a node is coupled to the pull-up means, and wherein the second transistor is enabled based on a node signal.

9. The circuit of claim 8, wherein the second and third transistors receiving an output signal from the third transistor are substantially simultaneously turned on to maintain the intermediate level of the input signal of the pull-up means.

10. The circuit of claim 8, wherein the first and second transistors are PMOS transistors and the third and fourth transistors are NMOS transistors, wherein the first reference voltage is a supply voltage and the second reference voltage is a ground voltage, and wherein a control electrode is a gate electrode, and wherein the pull-up means includes switching means.

11. The circuit of claim 10, wherein the switching means is a transistor.

12. The circuit of claim 8, further comprising a feedback delay unit, wherein the node signal is applied to a gate of the second transistor after passing through the feed back delay unit, wherein an inverted chip enable signal is applied to a gate of the third transistor, wherein an inverted delay unit output signal is applied to a gate of the fourth transistor.

13. The circuit of claim 12, wherein the feedback delay unit comprises first and second inverters coupled in series between the node and the gate of the second transistor, wherein a driving capacity of the first transistor is less than a driving capability of the second transistor.

14. The circuit of claim 1, wherein responsive to the ATD signal the input signal generation unit successively drives the input signal level of the pull-up means at the high level, the low level and then the intermediate level.

15. An address transition detection summation circuit, comprising;
    a pull-up circuit that performs pull-up based on an applied signal;
    an address transition detection summation unit that sums outputs from the pull-up circuit and a plurality of switching circuits that respectively receive an address transition detection (ATD) signal; and
    an input signal generation unit coupled to the address transition detection summation unit that generates a tri-level applied signal for the pull-up circuit based on a signal from the address transition detection summation circuit, wherein the input signal generation unit comprises,
    first and second transistors coupled in parallel between a first reference voltage and a node, wherein a second reference voltage is applied to a gate of the first transistor, and wherein the node is coupled to drains of the first and second transistors, and
    a delay, wherein a node signal is applied directly to the pull-up circuit as the applied signal, and wherein the node signal is applied to a gate of the second transistor after passing through the delay.

16. The circuit of claim 15, wherein the input signal generation unit generates an intermediate applied signal level when the ATD signal is a short pulse ATD signal.

17. The circuit of claim 15, wherein the input signal generation unit generates a high applied signal level when the ATD signal is a standard pulse ATD signal.

18. The circuit of claim 15, further comprising a delay unit that determines a width of an address transition detection summation signal input to the input signal generation unit.

19. The circuit of claim 18, further comprising a signal output unit coupled to the pull-up circuit, the address transition detection summation unit and the delay unit that outputs the address transition detection summation signal for transmission to an external circuit.

20. The circuit of claims 15, wherein the input signal generation unit comprises:

third and fourth transistors coupled in series between the node and a second reference voltage, wherein the node is coupled to drains of the first and second transistors; wherein an inverted chip enable signal is applied to a gate of the third transistor, wherein an inverted delay unit output signal is applied to a gate of the fourth transistor, and wherein the node is coupled to the pull-up circuit.

21. The circuit of claim 20, wherein the second and third transistors are both enabled.

22. The circuit of claim 20, wherein the first and second transistors are PMOS transistors and the third and fourth transistors are NMOS transistors, wherein the first reference voltage is a supply voltage and the second reference voltage is a ground voltage, and wherein a control electrode is a gate electrode, and wherein the pull-up circuit is a switching circuit.

* * * * *